United States Patent [19]

Matsumoto

[11] Patent Number: 4,893,072
[45] Date of Patent: Jan. 9, 1990

[54] APPARATUS FOR TESTING AN INTEGRATED CIRCUIT DEVICE

[75] Inventor: Takashi Matsumoto, Hadano, Japan

[73] Assignee: Hitachi, Ltd., Tokyo, Japan

[21] Appl. No.: 210,094

[22] Filed: Jun. 22, 1988

[30] Foreign Application Priority Data

Jun. 29, 1987 [JP] Japan .................................. 62-162158

[51] Int. Cl.⁴ ............................................. G01R 31/00
[52] U.S. Cl. ..................................... 371/223; 371/25.1
[58] Field of Search ................. 324/73 R; 371/21, 24, 371/25, 26

[56] References Cited

U.S. PATENT DOCUMENTS 4,430,735 2/1984 Catiller ............................ 324/73 R
4,584,683 4/1986 Shimizu ................................ 371/25

FOREIGN PATENT DOCUMENTS 63-119595 6/1988 Japan .

Primary Examiner—Reinhard J. Eisenzopf
Assistant Examiner—Edward Urban
Attorney, Agent, or Firm—Fay, Sharpe, Beall, Fagan, Minnich & McKee

[57] ABSTRACT

An IC tester for testing an IC device having clocked circuits operative to process a signal under control of a clock signal with a time delay shift comprises a generator for generating a test signal to be supplied to the IC device under control of a timing signal having a repetition period equal to the period of the clock signal, a generator for generating an expected signal to be hopefully delivered from the IC device in response to the test signal, a shifting circuit for effecting a time delay shift of the expected signal equal to the time delay shift in the clocked circuits in the integrated circuit device, and a comparator for comparing the output signal of the IC device responsive to the test signal with the expected signal delivered through the shifting circuit to thereby determine performance characteristics of the IC device.

13 Claims, 6 Drawing Sheets

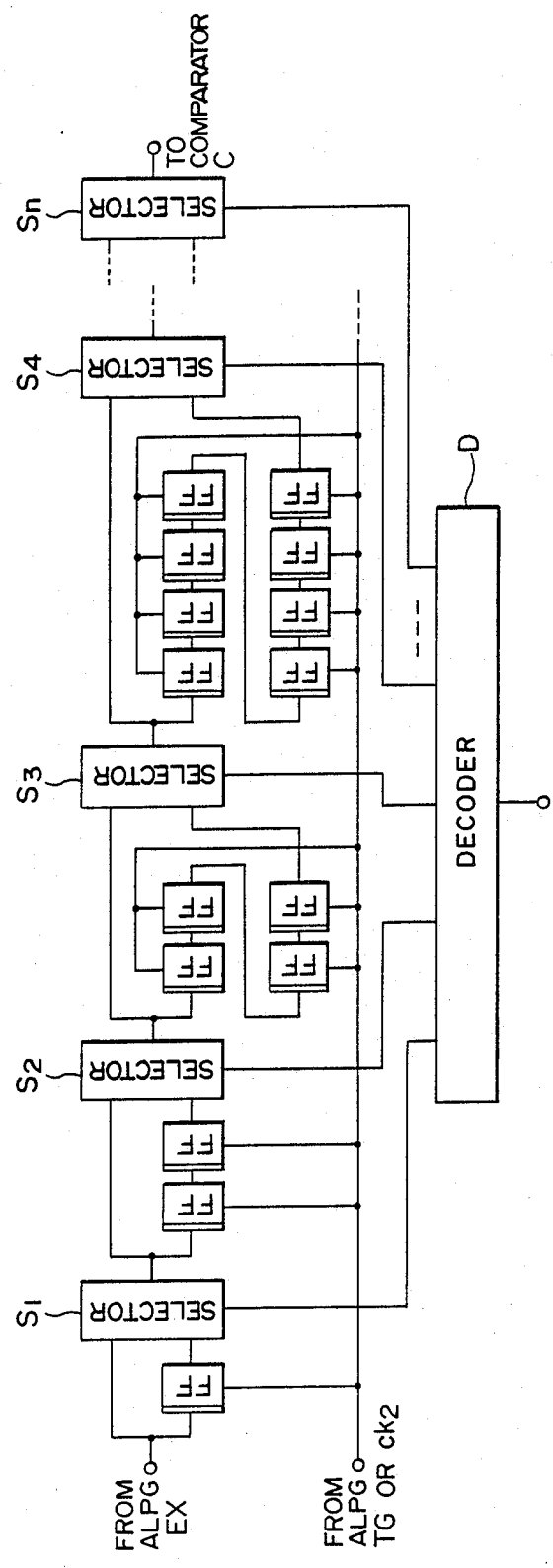
F I G. 4

APPARATUS FOR TESTING AN INTEGRATED CIRCUIT DEVICE

BACKGROUND OF THE INVENTION

The present invention relates to technology for checking the performance characteristics of an integrated circuit device (for example, an integrated circuit device having a memory circuit section), and more particularly to technology for testing the memory circuit section of an integrated circuit device which includes not only the memory circuit section but also a logic circuit section arranged around the memory circuit section, without being adversely affected by the time delay shift of the input and output of the memory circuit section due to the pipeline control in the logic circuit section (that is, the clock-control in the logic circuit section). It is a matter of course that the present invention is not limited to such an integrated circuit device.

In an integrated circuit device (hereinafter referred to as an "IC device") which is formed on a single chip and includes a memory circuit section, the performance characteristics of the memory circuit section is checked by an IC tester (namely, integrated circuit tester) in the following manner. That is, an address signal and an enable signal are sent from the IC tester to the IC device which is to be measured, and an output signal from the to-be-measured IC device responsive to the address and enable signals is compared with an expected signal generated by the IC tester, to check the performance characteristics of the memory circuit section.

The integration density in IC devices has been greatly increased in recent years. Accordingly, a large number of IC devices have been produced which have the following structure. That is, a memory circuit section and a multi-stage logic circuit section including a plurality of series-connected logic circuits cooperative with the memory circuit section are provided on a single chip to form an IC device. For example, an IC device includes a memory circuit section and such a multi-stage logic circuit section formed around the memory circuit section.

In such an IC device, plural logic stages in the multi-stage logic circuit section successively transmit a signal under control of a clock signal, and thus a time delay shift of the signal associated with the period of the clock signal is generated. Hence, the delay time of the output data signal from the to-be-measured IC device is different from the delay time of the expected signal from the IC tester, and moreover the difference in delay time between the output data signal and the expected signal varies. Thus, it is difficult to check the performance characteristics of the memory circuit section accurately.

In order to solve the above problem which arises in testing the memory circuit section of an IC device having a logic circuit section in addition to the memory circuit section, the following methods have hitherto been known.

For example, according to Japanese patent application JP-A-No. 59-119,595 (laid open on July 10, 1984), a circuit part operable in accordance with a predetermined clock signal in a test mode is formed in the IC device, to synchronize the output data signal from the IC device with the expected signal, thereby eliminating the differences in delay time between the output data signal and the expected signal. According to this method, the IC tester and the to-be-tested IC device are operated in synchronism with each other, and thus it can be prevented that the signal delay in the IC device is different from that in the IC tester. In this method, however, it is required to add a logic circuit section used only for testing the memory circuit section, to the IC device, and thus the whole of the IC device becomes large in scale and complicated in structure.

According to another method, a circuit for putting a latch circuit, which is included in the logic circuit section of a to-be-measured IC device to transfer an input signal under control of a clock signal, in a "through" state (that is, the state of the latch circuit capable of transferring the input signal thereto to the next stage without producing any delay time) is additionally provided, to prevent the signal delay in the IC device from being different from that in the IC tester. This method will be explained below in more detail, with reference to FIG. 1.

FIG. 1 is a block diagram showing a state that an IC tester is connected to an IC device which includes a memory circuit section and a logic circuit section, to test the memory circuit section.

Referring to FIG. 1, a logic circuit section L' is arranged around a memory circuit section M' of a to-be-measured IC device 1, and the memory circuit section M' is applied with an address signal through a series combination of latch circuits 10 and 11 and applied with an enable signal through a latch circuit 12. Further, a data signal from the memory circuit section M' is sent out to the outside through a latch circuit 13. Meanwhile, an IC tester 2 includes therein an algorithmic pattern generator (hereinafter referred to as "ALPG"), and the address and enable signals are sent from the ALPG to the memory circuit section M' through the logic circuit section L'. Further, an expected signal is sent from the ALPG to a comparator circuit C which is provided in the IC tester 2.

In the circuit configuration of FIG. 1, in order that the address and enable signals generated by the ALPG may reach the comparator circuit C in the IC tester 2 through the to-be-measured IC device 1 in the form of an output data signal, it is required that the latch circuits 10, 11 and 12 applied with the address or enable signal and the latch circuit 13 for sending out the output data signal are all put in a "through" state. Accordingly, the IC tester 2 includes means for applying a test clock signal having a logical value "1" to respective clock input terminals of the latch circuits 10 to 13, and each latch circuit is put in the through state by the test clock signal. Thus, the address, enable and output data signals can pass through the logic circuit section, and the output data signal reaches the comparator circuit C in the IC tester 2, to be compared with the expected signal.

This method, however, is not satisfactory as described below. In a case where a large number of latch circuits are connected in cascade to form a multi-stage circuit, it is difficult to provide input pins applied with the test clock signal, in the to-be-measured IC device 1. Further, this method is not applicable to a flip-flop circuit which does not have the through state but is triggered by a pulse edge. Accordingly, it is impossible to measure the switching time and other characteristics of a high-speed IC device which includes flip-flop circuits in place of latch circuits.

SUMMARY OF THE INVENTION

An object of the present invention is to provide an apparatus for testing an IC device having clocked circuits operative to process a signal under control of a clock signal with a time delay shift.

Another object of the present invention is to provide an apparatus capable of accurately testing a memory circuit section of an IC device which includes clocked logic circuits cooperative with the memory circuit section.

According to one aspect of the present invention, an apparatus for testing an IC device comprises means for generating a test signal to be applied to the IC device under control of a clock signal, means for generating an expected signal to be hopefully delivered from the IC device in response to the test signal, means for transferring the expected signal under control of the clock signal with a time delay shift associated with the period of the clock signal, and means for comparing the output signal of the IC device responsive to the test signal with the expected signal delivered from the expected-signal transferring means.

In an apparatus for testing an IC device in accordance with an embodiment of the present invention, the above-mentioned expected-signal transferring means includes a plurality of transferring circuits, the number of which is equal to the number of clocked logic circuits on a test-signal transmission line in the IC device. Thus, the expected signal passes through transferring circuits, the number of which is equal to the number of clocked logic circuits included in the logic circuit section of the IC device for transferring the test signal (for example, the address and enable signals), to reach the comparing means. Accordingly, at the comparing means, the output signal of the IC device and the expected signal are synchronized with each other, that is, the output signal is equal in delay time to the expected signal. Thus, the performance characteristics of the IC device can be accurately checked without adding any special circuit to the IC device.

BRIEF DESCRIPTION OF THE DRAWINGS

FIG. 4 is a block diagram showing another example of the signal transferring means which may be employed in an apparatus for testing an IC device in accordance with the present invention.

DESCRIPTION OF THE PREFERRED EMBODIMENTS

Figure 2:
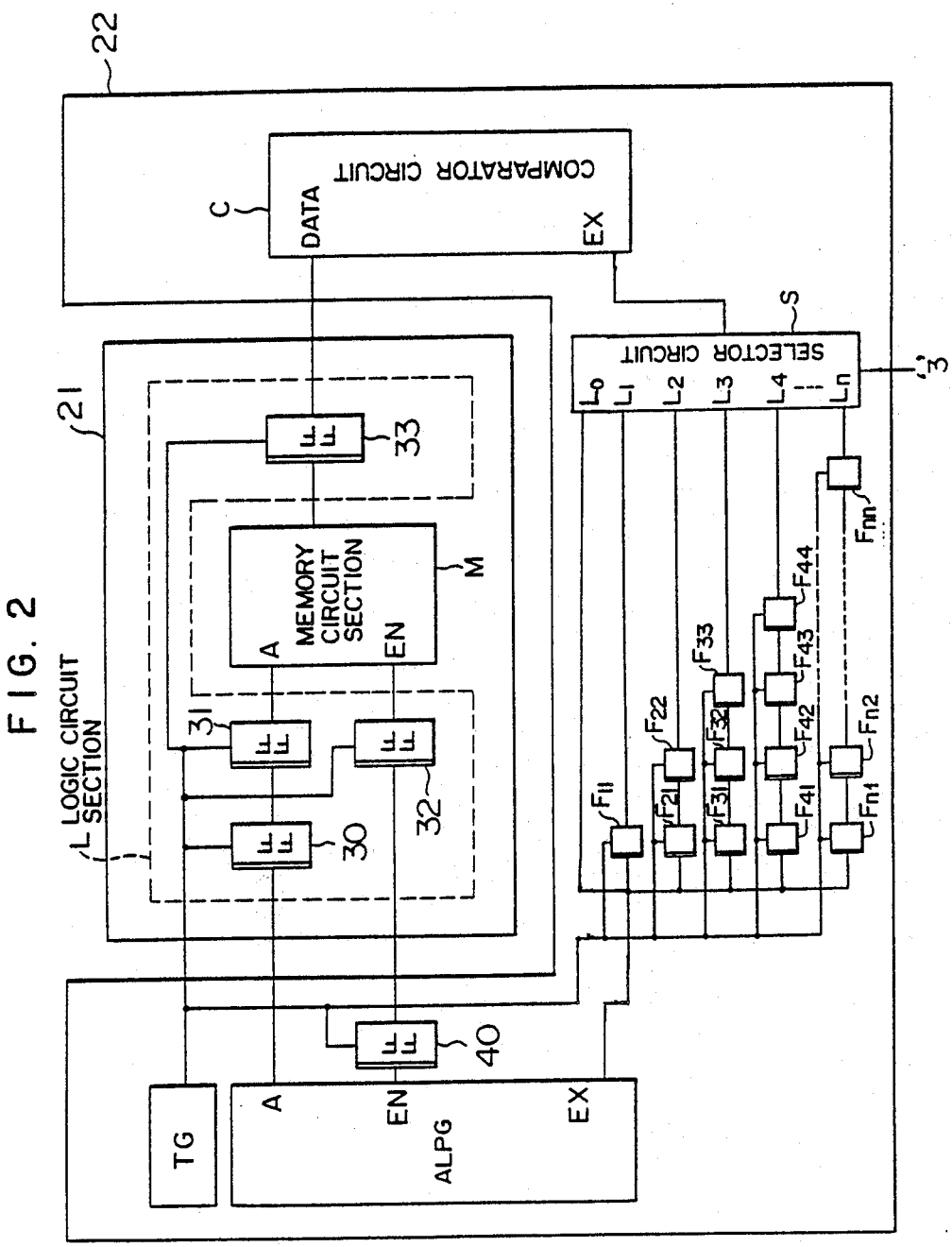
FIG. 2 is a block diagram showing a main part of an apparatus for testing an IC device in accordance with an embodiment of the present invention.
Figure 3:
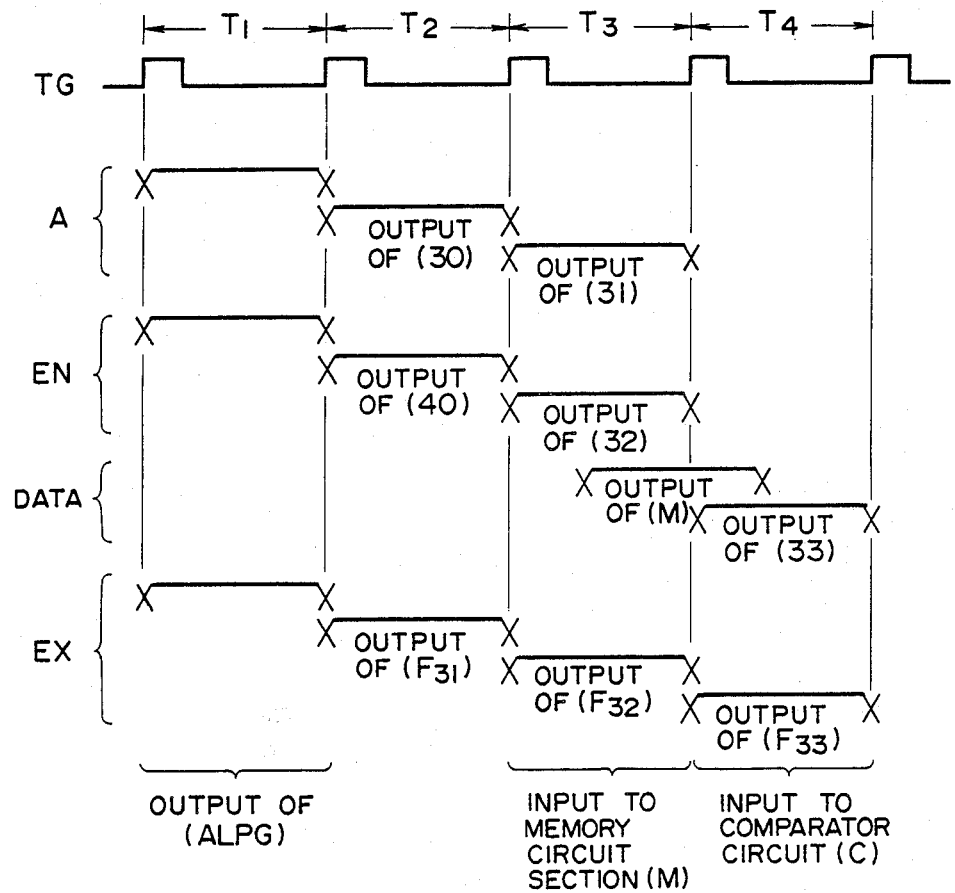
FIG. 3 is a time chart for explaining the operation of the embodiment of FIG. 2.

FIG. 2 shows a main part of an apparatus for testing an IC device in accordance with an embodiment of the present invention, and FIG. 3 is a time chart for explaining the operation of the embodiment of FIG. 2.

Referring to FIG. 2, an IC device 21 to be measured includes on a single chip a memory circuit section M and a logic circuit section L arranged around the memory circuit section, and part of input signal lines to the memory circuit section M (namely, all the input signal lines shown in FIG. 2) pass through the logic circuit section L. The remaining input signal lines are omitted from FIG. 2, for the sake of simplicity.

Figure 1:
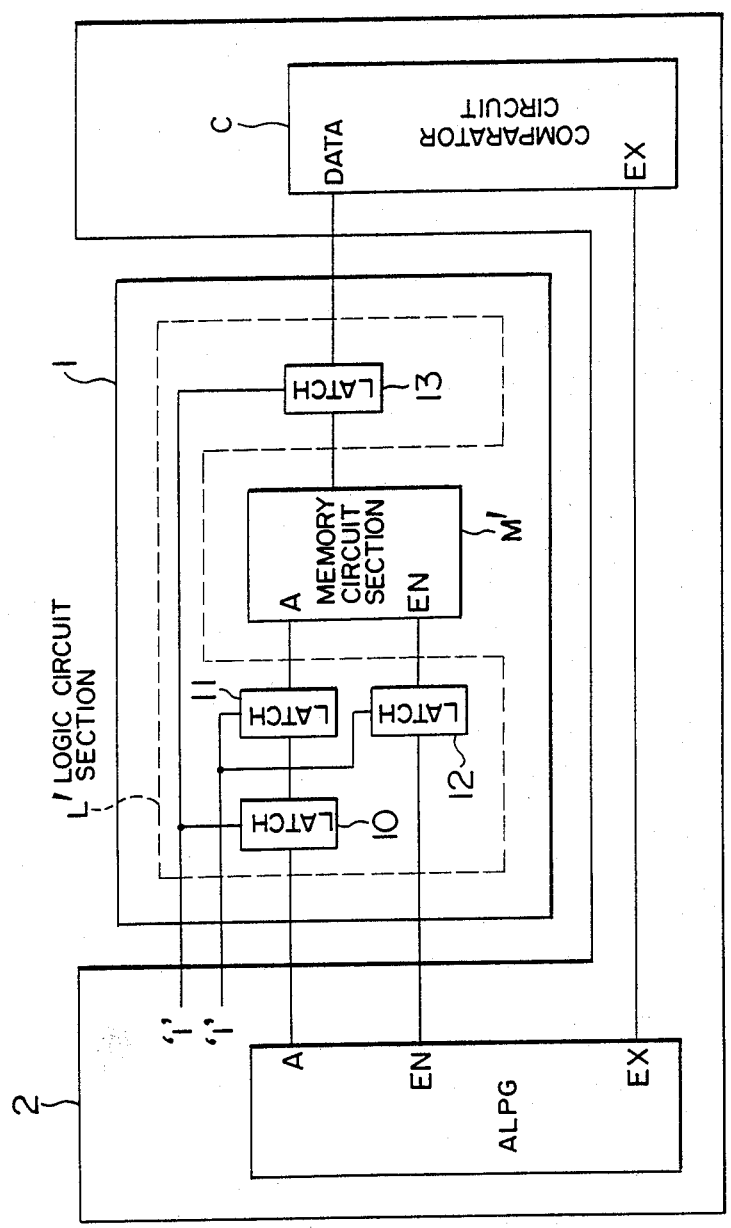
FIG. 1 is a block diagram showing an example of a conventional IC tester.

In order to make the operating speed of the IC device 21 far higher than that of the IC device 1 shown in FIG. 1, the logic circuit section L includes therein clocked flip-flop circuits 30, 31, 32 and 33. In more detail, the flip-flop circuits 30 and 31 are arranged on an address signal line, and the flip-flop circuit 32 is arranged on an enable signal line. Further, the flip-flop circuit 33 is arranged on an output data signal line from the memory circuit section M. Accordingly, an address signal from the outside is applied to the memory circuit section M through the flip-flop circuits 30 and 31, and an enable signal from the outside is applied to the memory circuit section M through the flip-flop circuit 32. Meanwhile, an output data signal from the memory circuit section M responsive to the address and enable signals is applied to an IC-device testing apparatus 22 through the flip-flop circuit 33. In FIG. 2, a flip-flop circuit is provided on each of the input side and output side of the memory circuit section M. However, a flip-flop circuit may be provided only on one of the input side and output side. Incidentally, the logic circuit section L includes gate circuits such as an OR gate and an AND gate in addition to the flip-flop circuits, but the gate circuits are independent of a clock signal and thus do not delay a signal.

The trigger input terminals of the flip-flop circuits 30 to 33 are connected to the same signal line, and the flip-flop circuits 30 to 33 are operated under control of a timing signal which is generated by a timing signal generator TG and has a repetition period equal to the period of a clock signal for operating the IC device.

The IC-device testing apparatus 22 includes the ALPG for generating an address signal A and an enable signal EN. The address and enable signals from the apparatus 22 are applied to the to-be-measured IC device 21. The present embodiment includes a flip-flop circuit 40 which is disposed on an enable output line so as to lie between the ALPG and the flip-flop circuit 32, and is controlled by the timing signal. This is because the address signal A is delayed twice by the flip-flop circuits 30 and 31 in the logic circuit section L and the enable signal is delayed only once by the flip-flop circuit 32, that is, the delay time of the address signal A due to the logic circuit section L is different from the delay time of the enable signal EN due to the logic circuit section L.

An expected signal EX which is generated by the ALPG, is transmitted through the IC-device testing apparatus 22 (namely, present embodiment) to reach a comparator circuit C provided therein. The present embodiment includes signal transferring means between the ALPG and the comparator circuit C. The signal transferring means includes a flip-flop circuit group and a selector circuit S. The flip-flop circuit group is divided into a flip-flop circuit $F_{11}$, a series combination of flip-flop circuits $F_{21}$ and $F_{22}$, a series combination of flip-flop circuits $F_{31}$, $F_{32}$ and $F_{33}$, a series of flip-flop circuits $F_{41}$, $F_{42}$, $F_{43}$ and $F_{44}$; and a series combination of flip-flop circuits $F_{n1}$ to $F_{nn}$. The expected signal EX from the ALPG is divided into a signal portion applied directly to an input terminal $L_0$ of the selector circuit S and signal portions applied to the flip-flop circuits $F_{11}$, $F_{21}$, $F_{31}$, $F_{41}$ and $F_{n1}$, and the outputs of the flip-flop circuits $F_{11}$, $F_{22}$, $F_{33}$, $F_{44}$ and $F_{nn}$ are applied to input terminals $L_1$, $L_2$, $L_3$, $L_4$ and $L_n$ of the selector circuit S, respectively. The selector circuit S can be readily constructed by the prior art, and is used for selecting one of $(n+1)$ signal transmission lines. Thus, the expected signal EX sent from the ALPG to the comparator circuit C can be delayed a desired number of times. In the circuit construction shown in FIG. 2, a test signal which is sent from the ALPG to the comparator circuit C through the IC device 21, is delayed by flip-flop circuits three times. Accordingly, a control signal indicative of numeral "3" is applied to the selector circuit 3, to select a signal transmission line connected to the input terminal $L_3$, thereby making the delay time of the expected signal equal to that of the test signal. The output of the selector circuit S is applied to the comparator circuit, to be compared with the output data signal from the IC device 21, thereby checking whether the operation of the IC device 21 is normal or not.

Each of the flip-flop circuits 30 to 33 and $F_{11}$ to $F_{nn}$ is triggered by the timing signal from the timing signal generator TG, that is, is operated in control of clock pulses.

Next, the operation of the present embodiment (namely, the IC-device testing apparatus 22) will be explained below, with reference to FIGS. 2 and 3.

The address signal A, enable signal EN and expected signal EX are simultaneously generated in the first period $T_1$ of the timing signal by the ALPG of the present embodiment. The address signal A is applied directly to the to-be-measured IC device 21, and is shifted twice by the flip-flop circuits 30 and 31 in the logic circuit section L of the IC device 21, that is, is shifted by two cycles ($T_2$, $T_3$) to reach the memory circuit section M of the IC device 21.

The enable signal EN is shifted by the flip-flop circuit 40 by one cycle ($T_2$), and is then shifted by the flip-flop circuit 32 in the logic circuit section L of the IC device 21 by one cycle ($T_3$) to reach the memory circuit section M. As mentioned above, the difference between the delay time (the number of times of shifting) of the address signal in the logic circuit section L and that of the enable signal in the logic circuit section L, is compensated for by the delay time (the number of times of shifting) of the enable signal due to the flip-flop circuit 40 in the present embodiment. Thus, the address signal and the enable signal are applied to the memory circuit section M with the same number times of shifting.

An output data signal DATA sent out from the memory circuit section M in response to the address signal A and enable signal EN applied thereto is further shifted by the flip-flop circuit 33 in the logic circuit section L by one cycle ($T_4$) to reach the comparator circuit C in the present embodiment. Thus, a three cycle shift is effected in the IC device 21 so that output data signal DATA is delivered to the testing device 22.

The expected signal EX generated simultaneously with the address signal A and the enable signal EN is applied to the comparator circuit C through the selector circuit S for changing the number of time shift stages. In the circuit construction of FIG. 2, the selector circuit S selects a signal line including a series combination of flip-flop circuits $F_{31}$, $F_{32}$ and $F_{33}$. Accordingly, the expected signal is delayed three cycles (that is, $T_2$–$T_4$), and then applied to the comparator circuit C through the selector circuit S.

Test cycles $T_1$ to $T_4$ shown in FIG. 3 are established with a timing signal generated by the timing signal generator TG, and FIG. 3 shows a manner of transference with time delay shifts of the address, enable and expected signals in the first to fourth periods. That is, the address signal A, the enable signal EN and the expected signal EX are simultaneously delivered from the ALPG in the first cycle $T_1$ of the timing signal. In the second cycle $T_2$, the address, enable and expected signals are delivered from the flip-flop circuits 30, 40 and $F_{31}$, respectively. In the third cycle $T_3$, the address, enable and expected signals are delivered from the flip-flop circuits 31, 32 and $F_{32}$, respectively. It is to be noted that owing to the delay of signal in the memory circuit section M, the output data signal is delivered from the memory circuit section M in the middle of the third cycle $T_3$. The output data signal DATA (which has been sent out from the memory circuit section in response to the address and enable signals) and the expected signal EX are delivered from the flip-flop circuits 33 and $F_{33}$, respectively, in the fourth cycle $T_4$, to be simultaneously applied to the comparator circuit C. The output data signal DATA and the expected signal EX are compared with each other by the comparator circuit C, to judge whether or not the to-be-measured IC device is normally operated.

As has been explained in the above, the present embodiment has the following advantages.

(1) The selector circuit S for changing the number of delay stages (namely, time delay shift stages) is provided on a signal path for transmitting the expected signal from the ALPG to the comparator circuit C, and thus the number of time delay shift stages for the expected signal can be made equal to the number of time delay shift stages for a test signal transmitted in the IC device. Accordingly, the expected signal and the output data signal which are equally delayed, are applied to the comparator circuit C, to be compared with each other. Thus, the performance characteristics of the IC device can be accurately checked, without generating a difference in delay time between the output data signal and the expected signal.

(2) Even in a case where an IC memory is provided with a logic circuit section including a flip-flop circuit which does not have a "through" state but is triggered by a pulse edge, the performance characteristics of the IC memory can be checked. Accordingly, the reliability of the IC memory is enhanced.

(3) As mentioned in the item (2), even when the logic circuit section includes a flip-flop circuit, the performance characteristics of the IC memory can be checked. That is, the switching time of a high-speed IC memory can be measured, and hence an IC memory can be formed which is excellent in stability of high-speed operation.

In the above, an embodiment of an apparatus for testing an IC device in accordance with the present invention, has been explained in detail. However, the present invention is not limited to the above embodiment, but various changes can be made without departing from the scope and spirit of the present invention.

For example, although in the present embodiment, the selector circuit included in signal transferring means for changing the number of delay stages is provided only on the expected signal line, the selector circuit is not limited to the expected signal line, but may be provided on the address signal line or enable signal line.

FIG. 4 shows another example of the signal transferring means which is included in the IC-device testing apparatus and disposed between the ALPG and the comparator circuit C.

Figure 6:
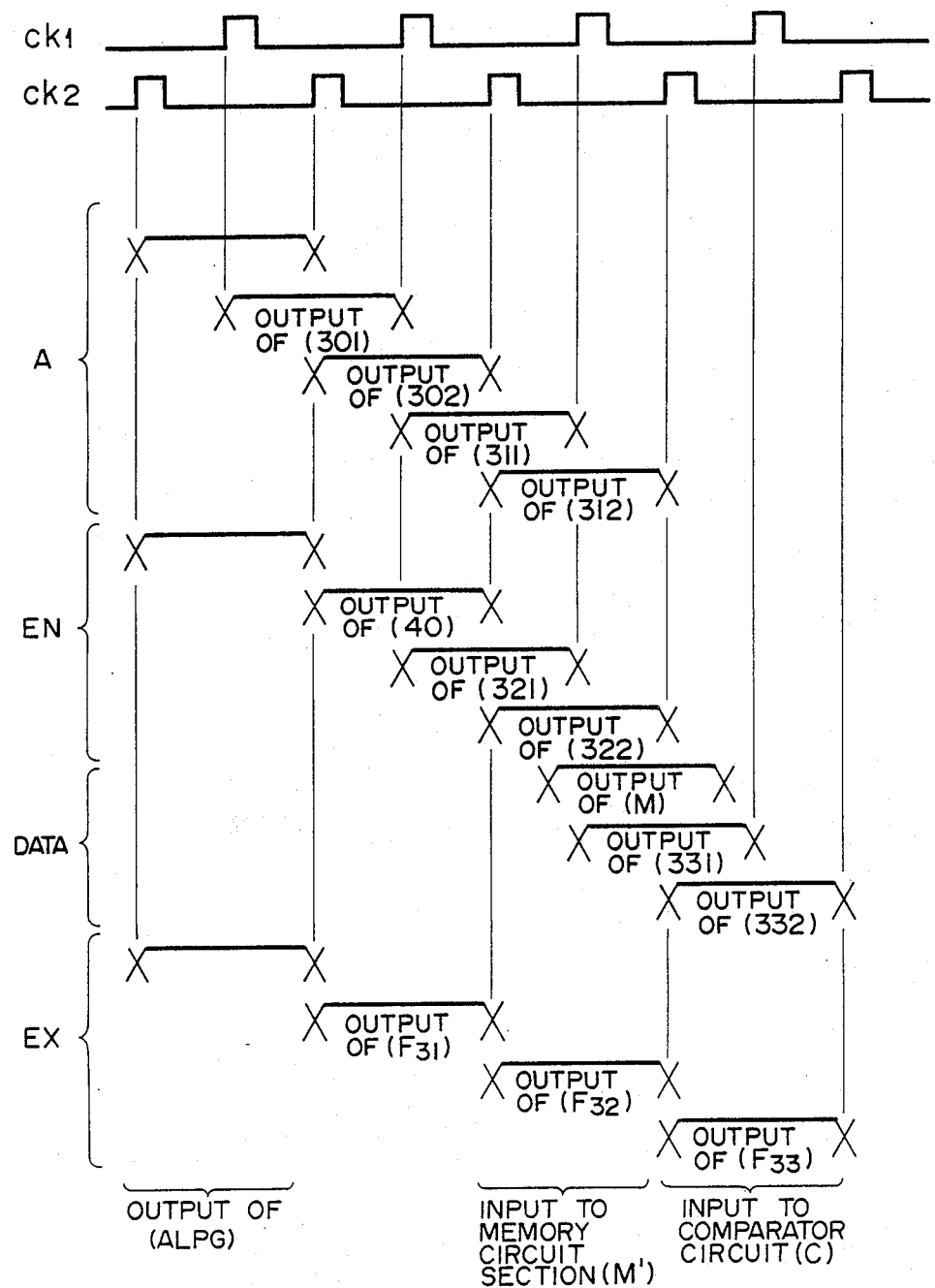
FIG. 6 is a time chart for explaining the operation of the embodiment of FIG. 5.

In FIG. 4, reference symbol FF designates a flip-flop circuit controlled by a timing signal TG or clock signal $ck_2$ (shown in FIG. 6). As shown in FIG. 4, the signal transferring means includes a plurality of stages (that is, time delay shift stages) and a decoder D for supplying a control signal to each of the stages, and each stage is made up of a flip-flop circuit or a series combination of flip-flop circuits, and a selector $S_i$. The first stage includes a selector $S_1$ whose first input terminal is applied with the expected signal EX from the ALPG, and a flip-flop circuit applied with the expected signal for shifting the expected signal by one cycle of the timing or clock signal to apply the shifted signal to the second input terminal of the selector $S_1$. One of two inputs to the selector $S_1$ is selected in accordance with a control signal from the decoder D. The second stage includes a selector $S_2$ whose first input terminal is applied with the output of the selector $S_1$, and a series combination of two flip-flop circuits applied with the output of the selector $S_1$ for shifting the output of the selector $S_1$ by two cycles of the timing or clock signal to apply the shifted output to the second input terminal of the selector $S_2$. Each of the third to n-th stages can be constructed in a manner similar to the above-mentioned manner. In this case, the n-th stage includes $2^n$ flip-flop circuits. Thus, the expected signal which has been delayed (shifted) a desired number of cycles is delivered from the selector $S_n$ of the n-th stage. The number of flip-flop circuits included in each stage may be made different from that shown in FIG. 4.

Further, the selector circuit S of FIG. 2 may be replaced by any external selection unit capable of establishing the number of shift stages.

In the above, explanation has been made of a case where the logic circuit section L of the to-be-measured IC device carries out a signal shift operation using flip-flop circuits. The present invention is also applicable to a case where the logic circuit section carries out a signal shift operation using latch circuits.

Figure 5:
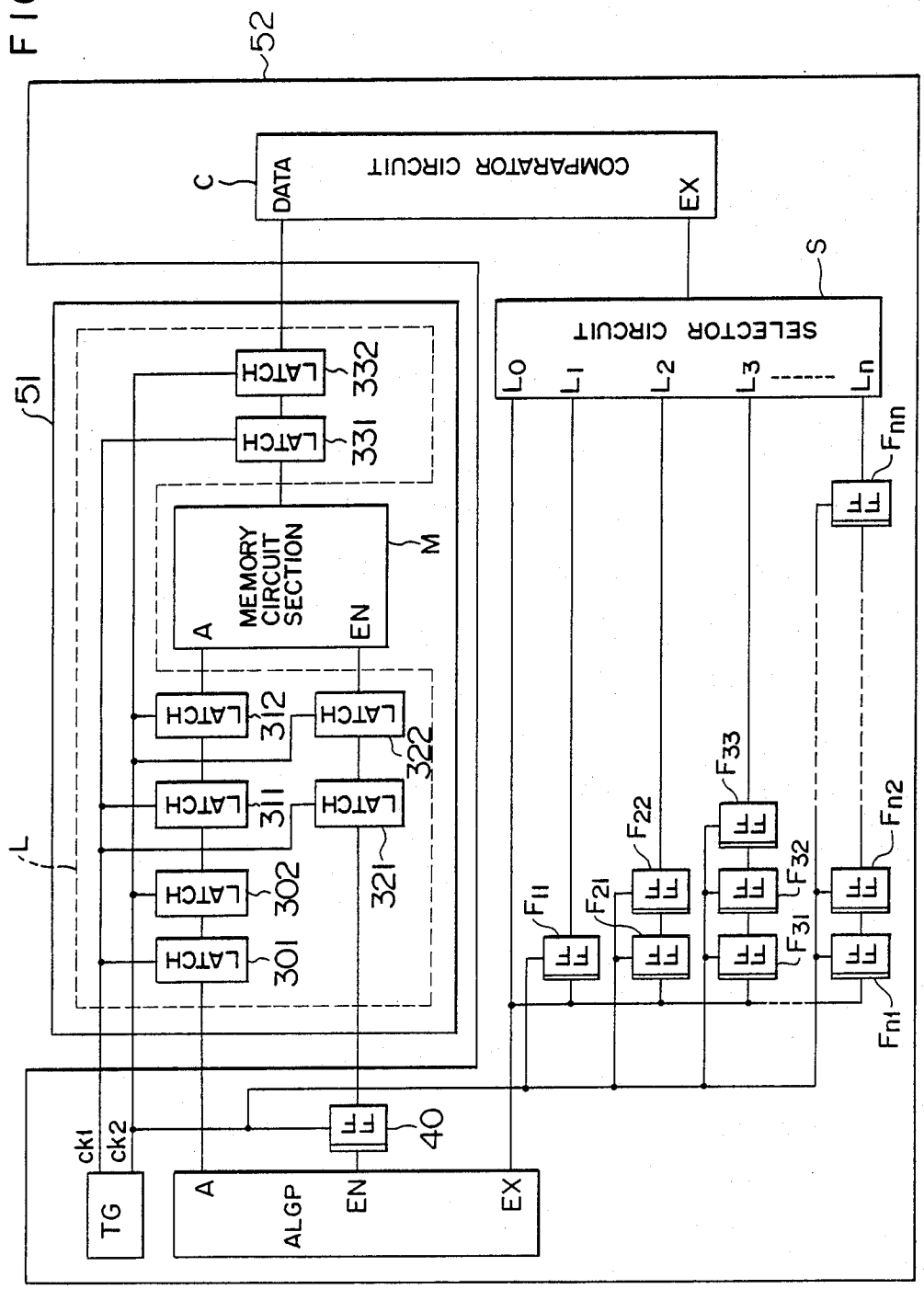
FIG. 5 is a block diagram showing a main part of an apparatus for testing an IC device in accordance with another embodiment of the present invention.

FIG. 5 shows another embodiment of an apparatus for testing an IC device in accordance with an embodiment of the present invention. Referring to FIG. 5, the address signal A is transferred to the memory circuit section M of an IC device 51 through latch circuits 301, 302, 311 and 312 which are included in the logic circuit section L and are controlled by two clock signals $ck_1$ and $ck_2$. The clock signals $ck_1$ and $ck_2$ have the same repetition period but are different in phase from each other. Further, the enable signal EN is transferred to the memory circuit section M through latch circuits 321 and 322 which are controlled by the clock signals $ck_1$ and $ck_2$, and the output data signal from the memory circuit section M is transferred to the comparator circuit C through latch circuits 331 and 332 which are controlled by the clock signals $ck_1$ and $ck_2$.

An IC-device testing apparatus 52 shown in FIG. 5 (that is, the present embodiment) is identical with the IC-device testing apparatus 22 of FIG. 2, except that the timing signal generator TG generates two clock signals $ck_1$ and $ck_2$. Similarly to FIG. 3, FIG. 6 is a time chart for explaining the operation of the IC-device testing apparatus of FIG. 5.

I claim:

1. An apparatus for testing an integrated circuit device comprising:
   means for generating a test signal to be supplied to said integrated circuit device under control of a clock signal so that said integrated circuit device produces an output signal in response to said test signal;
   means for generating an expected signal to be hopefully delivered from said integrated circuit device in response to said test signal;
   means connected with said expected signal generating means for transferring said expected signal under control of said clock signal with a time delay shift associated with the period of said clock signal; and
   means for comparing said output signal of said integrated circuit device with said expected signal delivered through said expected signal transferring means to check performance characteristics of said integrated circuit device.

2. An apparatus according to claim 1, in which said expected signal transferring means includes a plurality of transferring circuits each being arranged so as to be clocked by said clock signal to shift said expected signal by a time identical with the repetition period of said clock signal and a selector circuit for selecting a predetermined number of said clocked transferring circuits so that said expected signal is transferred to said comparing means with a time delay shift determined by the selected clocked transferring circuits.

3. An apparatus according to claim 2, in which each of said transferring circuits is a flip-flop circuit.

4. An apparatus according to claim 2, in which each of said transferring circuits is a latch circuit.

5. An apparatus according to claim 1, further comprising means connected with said test signal generating means for transferring said test signal under control of said clock signal with a time delay shift associated with the period of said clock signal so that said integrated circuit device produces said output signal in response to the so shifted test signal.

6. An apparatus according to claim 5, in which said test signal transferring means includes a plurality of transferring circuits each being arranged so as to be clocked by said clock signal to shift said test signal by a time identical with the repetition period of said clock signal and a selector circuit for selecting a predetermined number of said clocked transferring circuits so that said test signal is transferred to said integrated circuit device with a time delay shift determined by the selected clocked transferring circuits.

7. An apparatus according to claim 6, in which each of said transferring circuits is a flip-flop circuit.

8. An apparatus according to claim 6, in which each of said transferring circuits is a latch circuit.

9. An apparatus for testing a first circuit section in an integrated circuit device fabricated on a single chip, the integrated circuit device further having on the single chip a second circuit section arranged to be clocked with a clock signal, said first circuit section delivering an output signal responsive to an input signal supplied thereto, said second circuit section serving to process at least one of the input signal to and the output signal from said first circuit section under control of said clock signal with a time delay shift associated with the period of said clock signal, the apparatus comprising:
   means capable of generating said clock signal;

means for generating a test signal to be supplied to said first circuit section through said second circuit section in said integrated circuit device under control of said clock signal so that said first circuit section produces an output signal in response to said test signal;

means for generating an expected signal to be hopefully delivered from said first circuit section in response to said test signal;

means connected with said expected signal generating means for transferring said expected signal under control of said clock signal with a time delay shift associated with the period of said clock signal; and means for comparing said output signal of said first circuit section in said integrated circuit device with said expected signal delivered through said expected signal transferring means to check performance characteristics of said first circuit section in said integrated circuit device.

10. An apparatus according to claim 9, in which the time delay shift in said expected signal transferring means is equal to the time delay shift in said second circuit section in said integrated circuit device.

11. An apparatus for testing a memory circuit section in an integrated circuit device fabricated on a single chip, the integrated circuit device further having on the single chip a logic circuit section arranged to be clocked with a clock signal, said memory circuit section delivering an output signal responsive to an input signal supplied thereto, said logic circuit section serving to process at least one of the input signal to and the output signal from said memory circuit section under control of said clock signal with a time delay shift associated with the period of said clock signal, the apparatus comprising:

means capable of generating said clock signal;

means for generating an address signal and an enable signal to be supplied to said memory circuit section through said logic circuit section in said integrated circuit device under control of said clock signal so that said memory circuit section produces an output signal in response to said address and enable signals;

means for generating an expected signal to be hopefully delivered from said memory circuit section in response to said address and enable signals;

means connected with said expected signal generating means for transferring said expected signal under control of said clock signal with a time delay shift identical with said time delay shift in said logic circuit section in said integrated circuit device; and means for comparing said output signal of said memory circuit section in said integrated circuit device with said expected signal delivered through said expected signal transferring means to check performance characteristics of said memory circuit section in said integrated circuit device.

12. An apparatus according to claim 9, further comprising means connected with said test signal generating means for transferring said test signal under control of said clock signal with a time delay shift associated with the period of said clock signal wherein said first circuit section produces said output signal in response to the shifted test signal.

13. An apparatus according to claim 11, further comprising means connected with said address signal and enable signal generating means for transferring at least one of said address signal and enable signal under control of said clock signal with a time delay shift associated with the period of said clock signal wherein said memory circuit section produces said output signal in response to the shifted signal.

* * * * *